US008710483B2

(12) United States Patent
Yang et al.

(10) Patent No.: US 8,710,483 B2
(45) Date of Patent: Apr. 29, 2014

(54) MEMRISTIVE JUNCTION WITH INTRINSIC RECTIFIER

(75) Inventors: Jianhua Yang, Palo Alto, CA (US); John Paul Strachan, Stanford, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/258,499

(22) PCT Filed: Jul. 10, 2009

(86) PCT No.: PCT/US2009/050277

§ 371 (c)(1),
(2), (4) Date: Sep. 22, 2011

(87) PCT Pub. No.: WO2011/005266

PCT Pub. Date: Jan. 13, 2011

(65) Prior Publication Data

US 2012/0032134 A1 Feb. 9, 2012

(51) Int. Cl.
*H01L 45/00* (2006.01)

(52) U.S. Cl.
USPC ........................ 257/4; 438/382; 257/E45.002

(58) Field of Classification Search
USPC .............................................................. 257/4
See application file for complete search history.

(56) References Cited

U.S. PATENT DOCUMENTS 3,843,949 A 10/1974 Plough et al.
3,937,989 A 2/1976 Meijer
3,972,059 A 7/1976 Distefano
6,127,914 A * 10/2000 Sasaki ......................... 338/22 R
6,144,285 A * 11/2000 Higashi ........................... 338/15
6,780,683 B2 8/2004 Johnson
7,220,983 B2 5/2007 Lung
2003/0143790 A1 7/2003 Wu
2003/0173612 A1* 9/2003 Krieger et al. ................ 257/304
2005/0006640 A1 1/2005 Jackson
2006/0043595 A1 3/2006 Aratani et al.
2007/0221953 A1 9/2007 Sakamoto
2008/0079029 A1* 4/2008 Williams ...................... 257/213
2008/0090337 A1 4/2008 Williams
2008/0239797 A1 10/2008 Tsukamoto et al.
2008/0265235 A1 10/2008 Kamigaichi et al.
2011/0240941 A1* 10/2011 Pickett et al. ..................... 257/1
2011/0266510 A1 11/2011 Quitoriano et al.
2012/0012809 A1* 1/2012 Yang et al. ........................ 257/4

OTHER PUBLICATIONS

"Nonvolatile" Merriam-Webster Online Dictionary. 2012, http://www.merriam-webster.com (Nov. 4, 2012).
PCT International Search Report, Application No. PCT/US2009/000516, Report dated Aug. 28, 2009.
PCT International Search Report, Application No. PCT/US2009/000518, Report dated Jun. 29, 2009.
PCT International Search Report, Application No. PCT/US2009/050277, Report dated Apr. 12, 2010.
Driscoll, et al., "Phase-transition driven memristive system", Jan. 7, 2009, taken from website http://arxiv.org/abs/0901.0899.

* cited by examiner

*Primary Examiner* — Telly Green
*Assistant Examiner* — Damon Hillman

(57) ABSTRACT

A memristive junction (400) can comprise a first electrode (102) and second electrode (104), with a memristive region (106) situated between them. The memristive region is configured to switch between two activation states via a switching voltage (118) applied between the electrodes. The activation state can be ascertained by application of a reading voltage between the first electrode and second electrode. The junction further comprises a rectifier region situated at an interface (420) between the first electrode and the memristive region, and comprising a layer (402) of temperature-responsive transition material that is substantially conductive at the switching voltage and substantially resistive at the reading voltage.

15 Claims, 6 Drawing Sheets

200
204
206
202
204

MEMRISTIVE JUNCTION WITH INTRINSIC RECTIFIER

BACKGROUND

Nanoscale electronics promise a number of advantages including significantly reduced feature sizes and for relatively inexpensive, non-photolithography-based fabrication methods. Nanowire crossbar arrays can be used to form a variety of electronic circuits and devices, including ultra-high density nonvolatile memory. Junction elements can be interposed between nanowires at close contact intersections. These junction elements can be programmed to maintain two or more conduction states. Data can be encoded into these junction elements by selectively setting the state of the junction elements within the nanowire array. Increasing the robustness and stability of the junction elements can yield significant operational and manufacturing advantages.

DETAILED DESCRIPTION OF EXAMPLE EMBODIMENTS

Figure 1A:
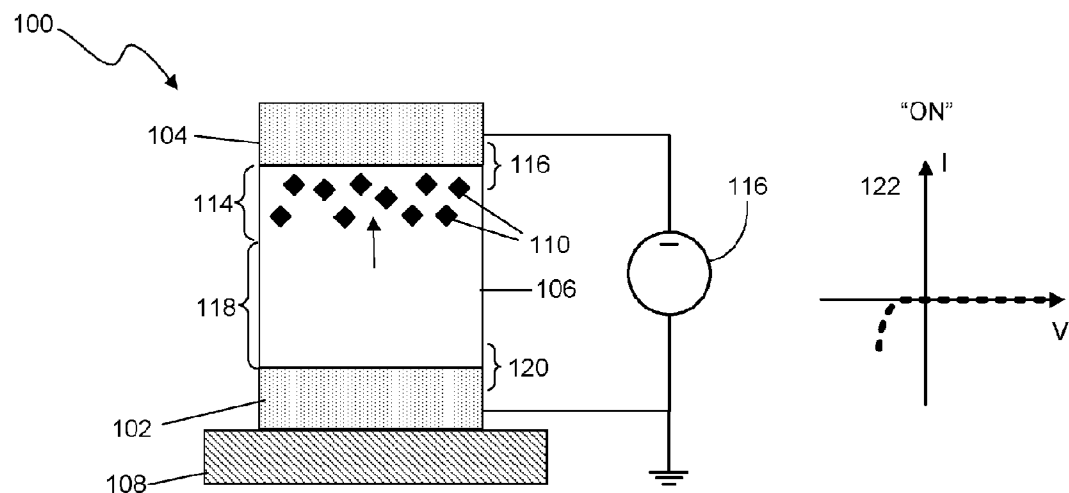
FIGS. 1A-1B are diagrams of two operational states of an illustrative memristive junction element, according to one embodiment described herein.

Reference will now be made to the exemplary embodiments illustrated, and specific language will be used herein to describe the same. Features and advantages of the invention will be apparent from the detailed description which follows, taken in conjunction with the accompanying drawings, which together illustrate, by way of example, features of the invention.

The present disclosure describes memristive junctions and devices based thereupon. The term "memristive" when used to describe a material or a component made of such a material generally refers to the ability to stably occupy one or more conduction-based activation states. This ability can be imparted to an appropriate material by introducing one or more species of dopants that can be induced to change their distribution within the material. Memristive junctions in accordance with the embodiments discussed herein exhibit the capability of occupying at least two states: 1) a state of little to no conductance to electronic current, which can be referred to as an "OFF" state; and 2) a state of increased conductance to current, which can be referred to as an "ON" state. A particular characteristic of the memristive materials and junctions is that either state can be induced by application to the junction of a sufficient switching voltage of the appropriate polarity. A further characteristic of such junctions is that, once induced, either state will persist indefinitely in the junction in the absence of such a voltage.

Memristive junctions can be programmed to occupy different readable states by application of bias voltage of appropriate strength and polarity. Memristive junctions can include interfaces that behave as rectifiers, providing for one-way current flow through the junction. However, such intrinsic rectifiers can be susceptible to breakdown under bias voltages. Therefore, embodiments of memristive junctions including breakdown resistant intrinsic rectification are discussed herein. Particularly, breakdown resistance can be provided by including temperature-responsive conductivity transition material at the rectifying interface. The embodiments are described in detail below.

FIG. 1 illustrates an exemplary memristive junction device 100. A memristive junction device may comprise a first electrode 102 and a second electrode 104, with an memristive region 106 situated between them. Such a junction can be made by depositing a metal or other appropriate material onto a substrate 108 so as to form a first electrode. The electrode may be deposited by conventional techniques including photolithography or electron beam lithography, or by more advanced techniques such as imprint lithography. The electrodes that are included in this device may be any suitable conductive material, including but not limited to gold, platinum, tungsten, or copper.

An memristive region may then be deposited onto the first electrode. The memristive region serves as the general region of the device in which switchable resistance characteristics are exhibited, and therefore comprises a memristive material that is suited to provide that function. In particular, the bulk of the memristive material can comprise a material that is electronically semiconducting or nominally electronically insulative. This includes materials known to be suitable as a dielectric in semiconductor devices. Non-limiting examples include oxides, sulfides, selenides, nitrides, phosphides, arsenides, chlorides, and bromides of silicon, transition metals, rare earth metals, or alkaline earth metals. In a particular embodiment, the switch junction material comprises a metal oxide. Non-limiting examples of such materials are titanium dioxide, hafnia, zirconia, strontia, and alumina. In a more particular embodiment, the switch junction material comprises titanium dioxide.

Suitable deposition techniques include conventional physical and chemical techniques, including evaporation from a Knudsen cell, electron beam from a crucible, sputtering from a target, electron beam evaporation, chemical vapor deposition (CVD), metal-organic chemical vapor deposition (MOCVD), molecular beam epitaxy, atomic layer deposition, or other forms of chemical vapor or beam growth from reactive precursors. The memristive region material may be deposited as a thin film from 1 to 100 nanometers thick.

The various conductance states in the junction can be determined by mobile dopants 110 in the memristive material. These dopants can include charged vacancies, anions, cations, or other known electronic charge carriers. In particular, the memristive region can further comprise a number of mobile dopants that can be induced to move through the memristive material by application of a sufficient switching voltage. The distribution of the dopants—and therefore the degree of doping of the memristive material—determines the conductance state of the junction. Mobile dopants can be added to the memristive material via any suitable technique, such as sputtering, electron beam evaporation, molecular beam epitaxy, CVD, MOCVD, or atomic layer deposition (ALD). Dopants may be introduced by depositing an initiator material that reacts with the memristive region material to create mobile dopants. In some embodiments these mobile dopants can be vacancies. For example, oxygen vacancies can be created by initiator/memristive material reactions such as $TiO_{2-x}$, with $TiO_2$; $ZrO_{2-x}$ with $ZrO_2$, or $SrTiO_{3-x}$ with $SrTiO_3$. In another example, nitrogen vacancies can be created by reacting GaN with $GaN_{1-x}$. In other embodiments the mobile dopants may be ions, such as sulfide ions produced by a GaN:S initiator layer on an memristive region including GaN.

In an illustrative embodiment, shown in FIG. 1A, the memristive material may be a titanium dioxide ($TiO_2$) matrix and the mobile dopants 110 may be oxygen vacancies in that matrix. In this case, the oxygen vacancies serve as positive charge carriers. By applying a negative switching voltage 112 to the second electrode 104 relative to the first electrode 102, an electrical field of sufficient intensity to move the dopants up toward the second electrode can be achieved. The upward drift of the dopants creates a doped region 114 at the interface 116 with the second electrode, and leaves an undoped region 118 within the rest of the matrix. It should be noted that "doped" and "undoped" as used herein as comparative terms, where a "doped region" is substantially more heavily doped than an "undoped region." It is not necessarily true, however, that an "undoped region" will be completely devoid of dopants. Rather, dopants are sufficiently scarce in an undoped region that the region has a substantially lower electronic conductance than a doped region.

As a result of the mobile dopants 110 being grouped at the electrode-matrix interface 116, the interface becomes essentially ohmic in nature due to the reduced conductance barrier. The interface is characterized by relatively high conductivity. The interface 120 of the undoped $TiO_2$ with the metal first electrode 102, however, acts as a Schottky-like interface. Such an interface acts as a rectifier, allowing current to flow in one direction (in this case, positive current can flow from the electrode into the junction) but not in the other direction. This property is illustrated by the I/V graph 122, without intending any limitation to particular voltage or current values. The result is that the junction 100 can conduct current in the appropriate direction when subjected to moderate voltages, i.e. lower than the switching voltage. In this condition the junction can be said to be switched "ON."

Figure 1B:
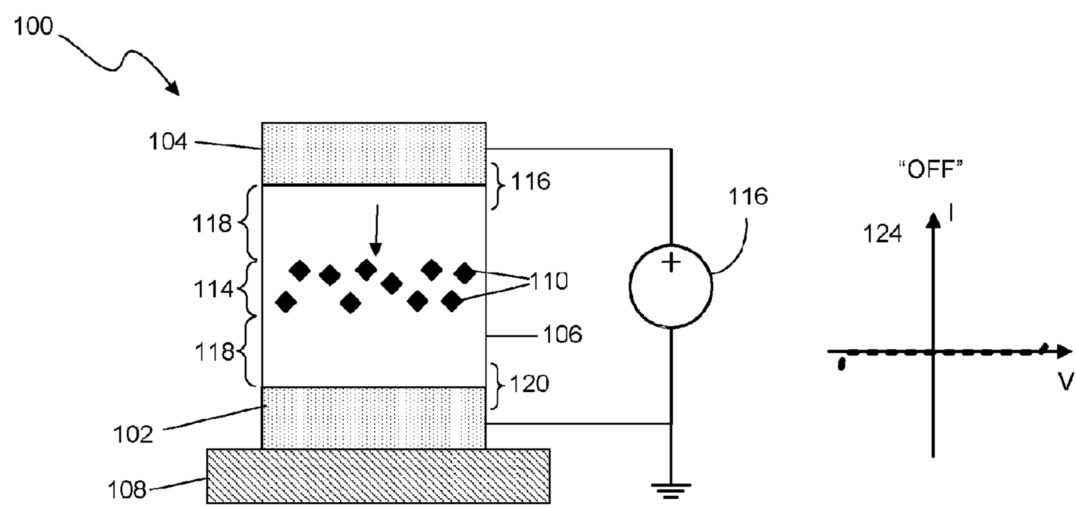

In a similar illustrative example shown in FIG. 1B, a sufficient switching voltage 112 of opposite polarity (i.e. positive at the top electrode 104) can induce the vacancies to move away from the matrix electrode interface. This creates an undoped region 118 at the upper interface 116 as well as at the lower interface 120, i.e. two Schottky-like interfaces of opposite bias direction. In this condition, little to no current can flow through the junction in either direction under moderate voltage, as illustrated in the UV graph 124. In this state the junction can be said to be "OFF."

As described above, memristive junctions can be reversibly set to at least two activation states by applying a switching voltage of sufficient magnitude. In a particular embodiment, a sufficient voltage for switching the state of the device is from about 1.0 V to about 2.5 V. The state so set will remain until a switching voltage is applied. Each memristive junction can serve as the basis for a nonvolatile memory element in a data storage architecture.

Figure 2:
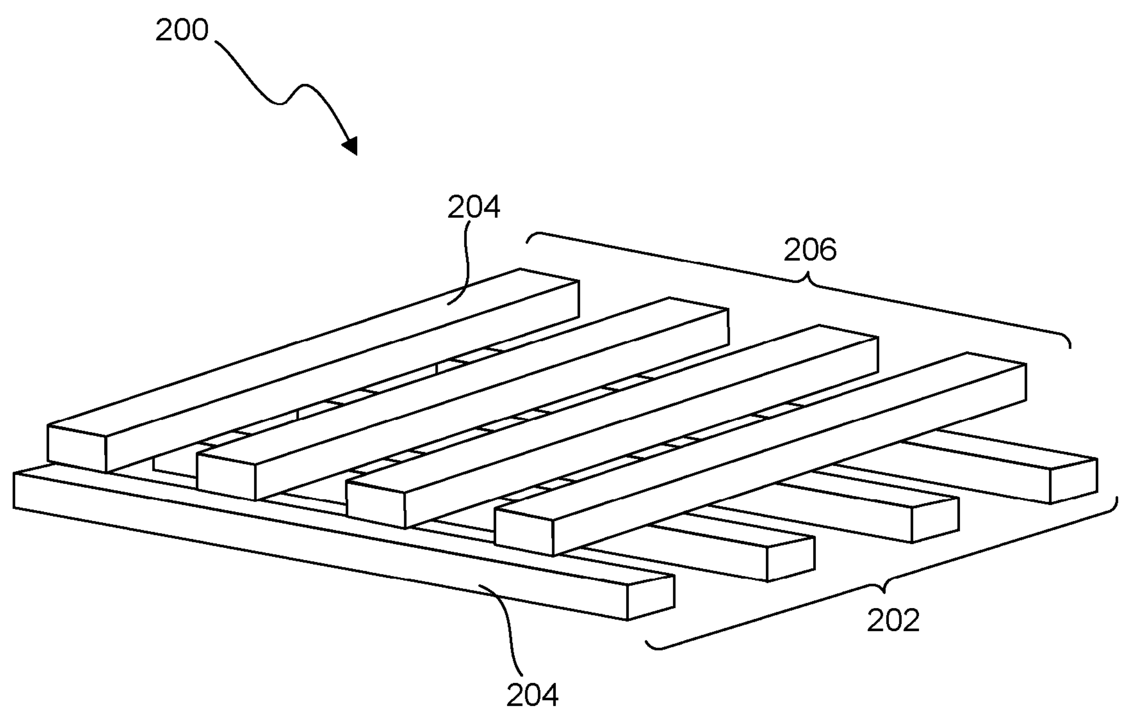
FIG. 2 is a perspective view of one illustrative embodiment of a nanowire crossbar architecture, according to one embodiment described herein.

In one illustrative embodiment of such a structure, a plurality of memristive junctions can be incorporated in a crossbar array 200 as shown in FIG. 2. The crossbar array is composed of a first layer 202 of approximately parallel nanowires 204 that are overlain by a second layer 206 of approximately parallel nanowires. The nanowires of the second layer are oriented approximately perpendicular to the nanowires of the first layer, although the orientation angle can vary. Although individual nanowires in FIG. 2 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of submicroscale wires, microscale wires, or wires with larger dimensions, in addition to nanowires.

The layers 202, 206 may be fabricated using a variety of techniques including conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semiconductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

The two layers of nanowires form a lattice where each wire of the first layer 202 overlies every wire of the second layer 206, and comes into close contact at each intersection with those wires. A memristive junction as described above can be situated at each intersection and serve as the electrical contact between a pair of nanowires. In this way, each nanowire in the first layer can have an electrical contact with each nanowire in the second layer. The first electrode 102 and second electrode 104 of each memristive junction 100 are each in electrical contact with one of the intersecting wires. In a particular embodiment, the intersecting wires can themselves serve as the electrodes.

In the array, each of the memristive junctions can be used to represent bits of data. For example, in the simplest case, a junction may have two states: a conductive state and a nonconductive state. The conductive state may represent a binary "1" and the nonconductive state may represent a binary "0" or vice versa. Thus binary data can be written into the array by changing the conductive state of junction elements. The data can then be retrieved by sensing the state of the junction elements.

The state of a memristive junction can be read by applying a reading voltage to the electrodes of the junction. For example, a memristive junction as illustrated above and in FIG. 1 can be read by applying a negative voltage to the second (upper) electrode relative to the first (lower) electrode. In order to read the state without affecting it, a reading voltage magnitude can be chosen that is too low to induce movement of mobile dopants, but will induce current flow in an activated junction. The reading voltage need only be sufficient to produce a current that is readable above any noise in the device or reading circuitry. Therefore, under appropriate conditions it is possible to utilize very low reading voltages. In one embodiment, a suitable reading voltage magnitude can be from 0.01 V to 0.8 V. In the "ON" state, a moderate reading voltage will cause a detectable current to flow through the junction from the first electrode to the second electrode. In the "OFF" state, little or no current may flow. The presence or absence of current, or difference in current strength, can thereby convey the state of the junction to the reading circuitry.

Figure 3A:
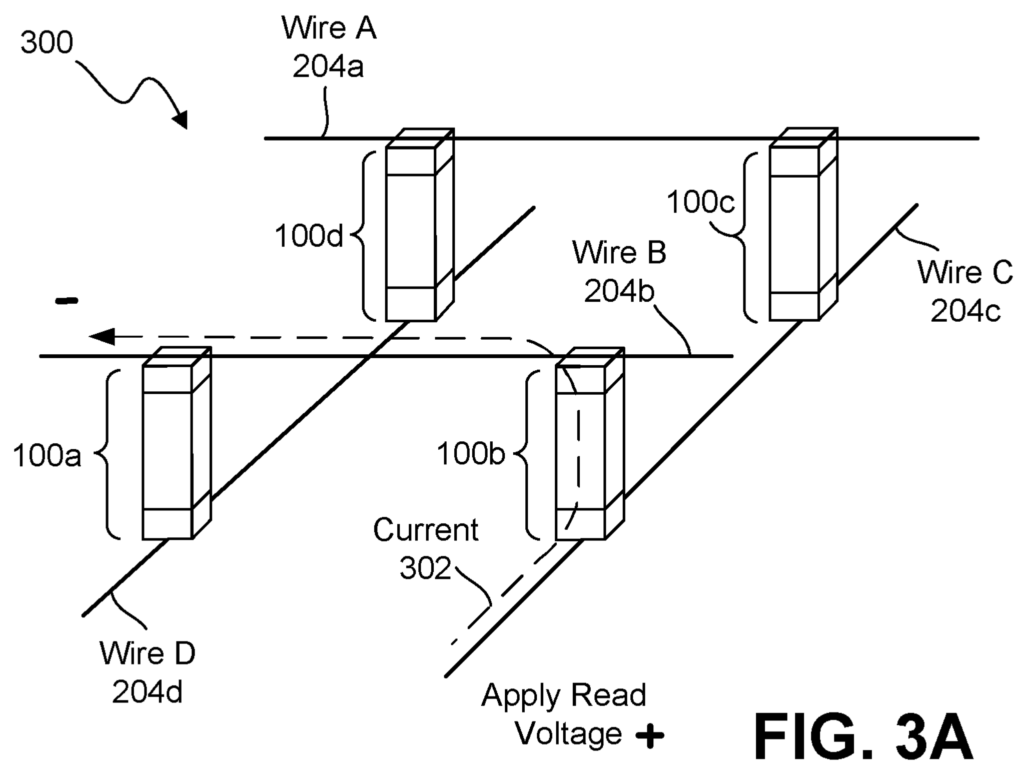
FIGS. 3A-3C are illustrative diagrams which show current paths through a portion of a crossbar memory array, according to one embodiment described herein.

This same principle operates in the crossbar architecture, an example of which is shown in FIG. 3A. For purposes of illustration, only a portion of the crossbar architecture 300 has been shown and the nanowires 204 have been shown as lines. Nanowires A and B are in an upper layer of nanowires and nanowires C and D are in a lower layer. Junctions 100*a-d* connect the various nanowires at their intersections. According to this illustrative embodiment, the state of a junction 100*b* between wire B and wire C can be read by applying a negative read voltage to wire B relative to wire C. Ideally, if a current 302 flows through the junction when the read voltages are applied, the reading circuitry can ascertain that the junction is in its "ON" state. If no current, or an insubstantial current, flows through the junction, the reading circuitry can ascertain that the junction is in its "OFF" state.

The "ON" and "OFF" states of the memristive junctions can be effective in encoding information due to the large difference in resistance between the two states, making them easily distinguishable by reading circuitry. However, it should be noted that the resistance of these devices can be sizable even in the "ON" state. For example, while an "OFF" junction can exhibit a resistance of tens to hundreds of megaohms, the resistance of an activated junction can be in the range of tens to hundreds of kiloohms. As a result of the high resistance of these junctions, devices based on them can be read and written in low current regimes and consume relatively little power during operation.

Figure 3B:
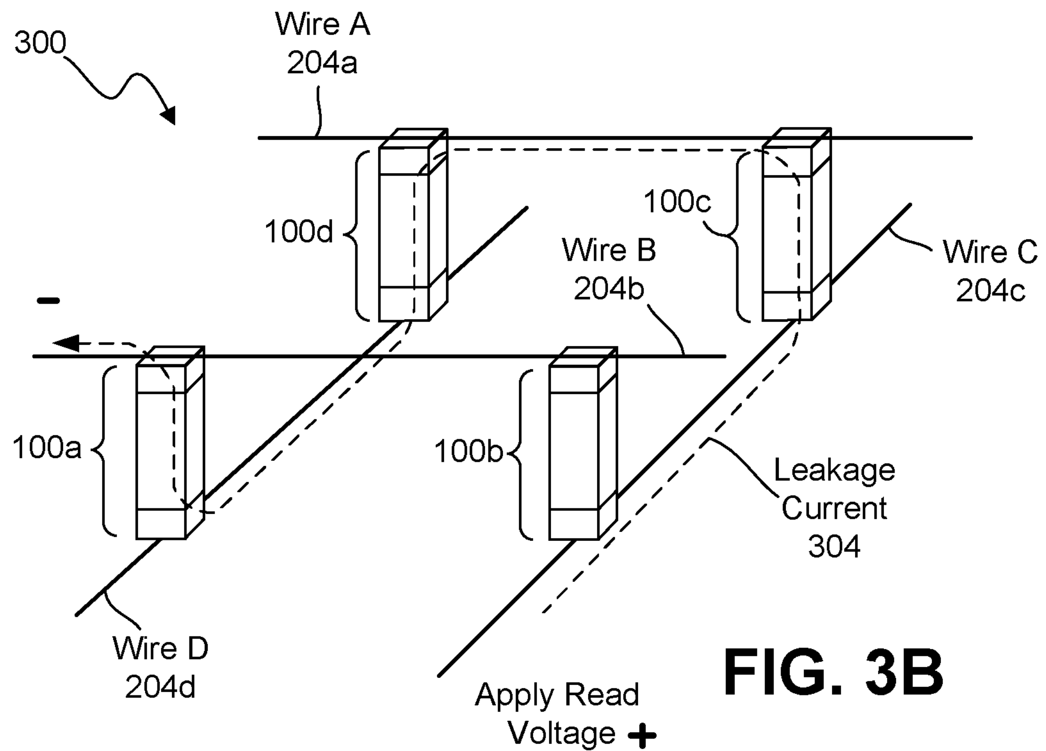

In such a crossbar array architecture of memristive junctions where information is represented largely by conductive states, crosstalk between junctions can adversely affect data reading. That is, interrogation of one junction with a reading voltage may also result in a number of leakage currents 304 traveling by other paths in the array, as illustrated in FIG. 3B. These leakage currents can act as a type of electrical "noise" in that they are spurious currents that may be detected by reading circuitry and therefore obscure the desired reading of the junction 100*b*.

Figure 3C:
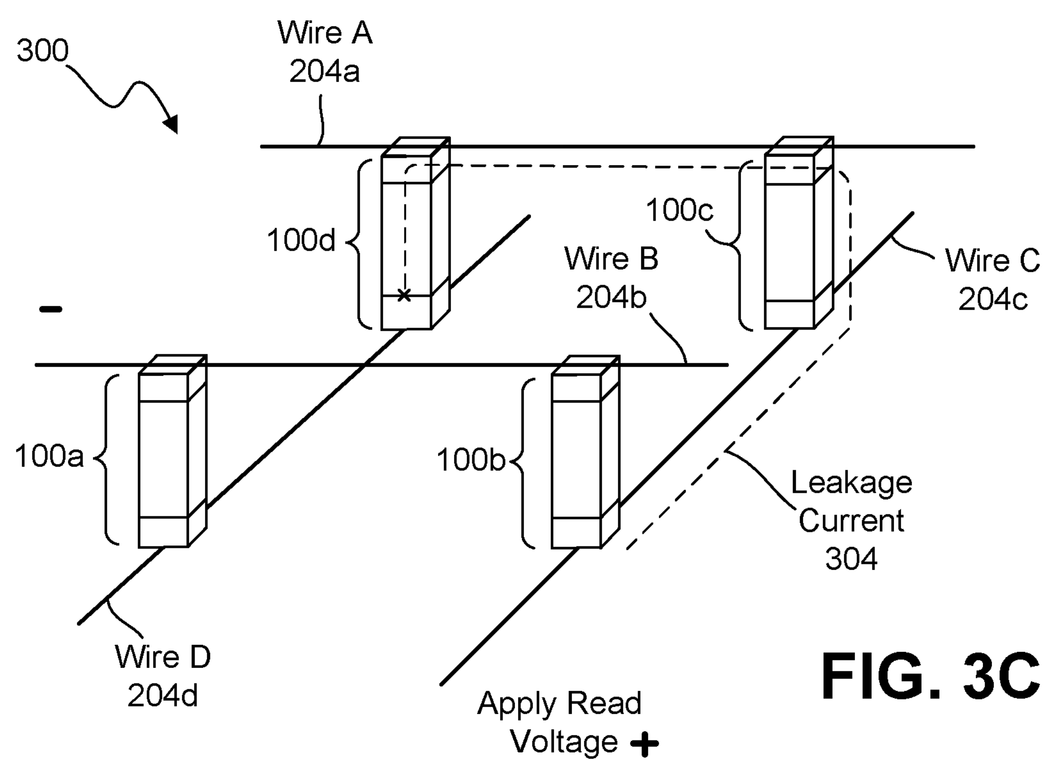

The problem of crosstalk is addressed to an extent by the rectifying interfaces in junction devices such as discussed above and illustrated in FIGS. 1A and 1B. For example, the undoped matrix-to-electrode interface 120 in a switch junction in the "ON" state (e.g. FIG. 1A) prevents current from flowing downward through the junction and into the lower wire. This rectification prevents the junction from serving as a path for leakage current that would affect the reading of neighboring junctions. Consequently, in an array in which each junction incorporates this behavior, current can flow from the lower wires of the array to the upper wires, but not in the opposite direction. This is illustrated in FIG. 3C, where a reading voltage applied to a junction 100*b* in the "OFF" state will result in no detectable current on wire B. Specifically, the leakage current 304 is blocked as the leakage current attempts to travel through the neighboring junction 100*d*. Other leakage paths are similarly blocked as they attempt to pass from nanowires in the upper layer to nanowires in the lower layer.

The intrinsic rectifier behavior in these junction devices can provide a useful property under reading conditions. However, these diode interfaces can break down when they are subjected to higher reverse-bias voltages. Such higher voltages can include switching voltages, e.g. a switching voltage used to turn an activated junction to an "OFF" state. The mobility of the dopants within the memristive matrix can be exponentially dependent on the applied voltage. Consequently, it can be desirable to use high programming voltages to achieve fast write times and accurate junction states.

Diodes and diode-like interfaces have a characteristic reverse voltage, termed the dielectric breakdown voltage, at which the barrier to the flow of reverse current breaks down. Once this dielectric breakdown voltage is exceeded, the interface becomes permanently conductive and current can flow relatively unimpeded through the barrier. The term "breakdown voltage" as used herein refers to such irreversible chemical and/or physical changes at an interface, rather than reversible breakdown mechanisms such as those found in avalanche diodes or Zener diodes. In some cases, a dielectric breakdown can occur with forward-bias if current and heating at the interface are great enough to chemically alter the interface.

In a particular embodiment, a memristive junction can include an intrinsic rectification component that is not susceptible to the problem of breakdown at switching voltages. In a more specific embodiment, the junction can comprise a material at an interface of the memristive region material and an electrode, where the material is conductive at switching voltages and less conductive at lower voltages (e.g. reading voltages). At moderate voltages such an interface can thereby exhibit the diode-like behavior described above, while providing little resistance (and experiencing a small voltage drop) at higher switching voltages.

In a more particular embodiment, a thin layer of a temperature-responsive transition material is incorporated in the device at the interface of the memristive region and one of the electrodes. The term "temperature-responsive transition material" as used herein refers to materials known to experience a substantial and reproducible change in conductivity as a function of temperature. More specifically, such materials undergo a transition from a conductive material to an insulative material at a particular temperature. In some materials this change in electrical property is accompanied by a change in optical properties of the material. Known examples of such materials include vanadium dioxide. Other materials are particularly known for exhibiting temperature-driven optical changes, but to the extent any of them exhibit changes in conductivity they may be used in accordance with the embodiments discussed herein. These include oxides of manganese, molybdenum, titanium, and iron. A number of composites of these elements have also been found to exhibit temperature-responsive phase changes, and may further include elements such as cadmium, mercury, tellurium, and selenium. In a particular embodiment, the temperature-responsive transition material used is vanadium dioxide ($VO_2$). Vanadium dioxide is known to undergo an abrupt change from a transparent semiconductive phase to a reflective conductive phase upon heating to about 68° C. This phase transition temperature can be tuned up or down by changing the ratio of V and O or adding impurities to the vanadium dioxide.

Figure 4A:
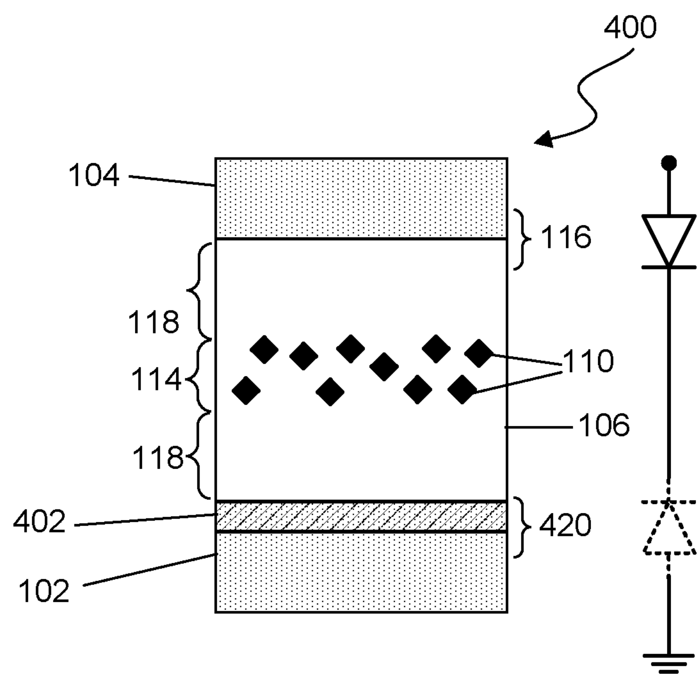
FIGS. 4A-4B are diagrams of two operational states of a memristive junction element with a stable rectification component, according to one embodiment described herein.
Figure 4B:
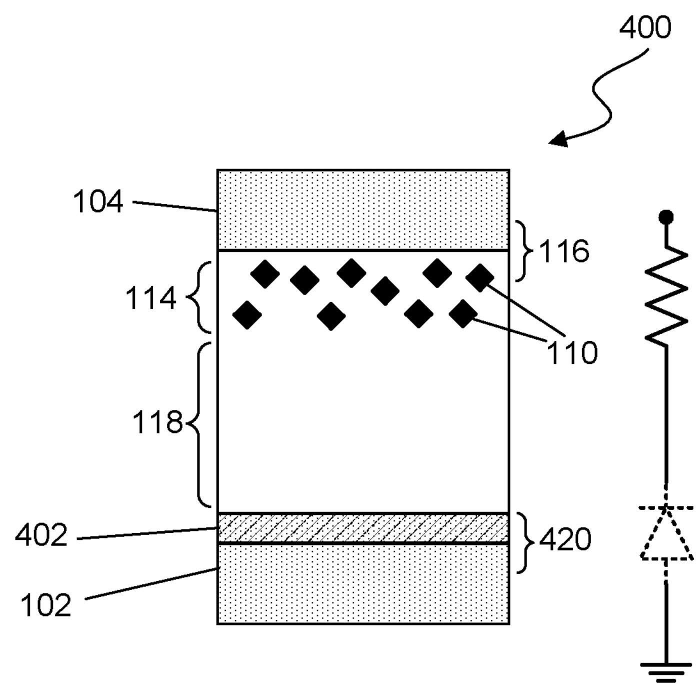

In a particular embodiment, a memristive junction with intrinsic rectification includes a thin layer of vanadium dioxide situated at one of the interfaces between the memristive region and an electrode. An example of this embodiment is shown in FIGS. 4A and 4B, in which a memristive junction 400 similar to that illustrated in FIG. 2 has a $TiO_2$ memristive region 106 doped with oxygen vacancies, and additionally includes a vanadium dioxide layer 402 situated at the interface 420 between the memristive region and the lower electrode 102. It should be noted that this placement of the $VO_2$ layer is exemplary, and that such a layer could alternatively be situated at the interface between the memristive region 400 and the upper electrode 104.

The electrical characteristics of the interfaces are represented by the circuit symbols to the right of each junction diagram. One result of the inclusion of the temperature-responsive transition material is that the rectifying interface 420 has a voltage-dependent nature (indicated by a diode rendered in dashed lines). At lower voltages, the high resistance $VO_2$ layer provides a Schottky-like rectifying interface 420 with the electrode. To illustrate, one may consider an exemplary negative reading voltage applied to the second electrode 104 relative to the first electrode 102 (which may be at ground as shown in FIG. 4). If no mobile dopants 110 are doping the interfaces, then both interfaces 116, 420 are Schottky-like (represented as head-to-head diodes in FIG. 4A). In this state the junction is "OFF" and current cannot flow in either direction through the junction in response to the reading voltage.

When this reading voltage is applied to a junction in the "ON" state, i.e. the interface 116 is doped and therefore ohmic, (represented as a resistor in FIG. 4B), current may flow from the first electrode up to the second electrode. However, due to the rectifying characteristic of the $VO_2$-electrode interface 420, current does not flow in the opposite direction in response to a moderate reverse bias reading voltage. Likewise, the junction will not pass a leakage current in that direction when a neighboring junction is read.

As described above, the state of the junction can be switched by application of a voltage sufficient to move the dopants and change the conductivity of the memristive region. For example, the oxygen vacancy-doped junction shown in FIG. 4A may be activated by applying a top-negative switching voltage of sufficient strength. The switching current flows through the forward-biased $VO_2$ interface and the dopants move toward the second electrode 104.

Figure 5:
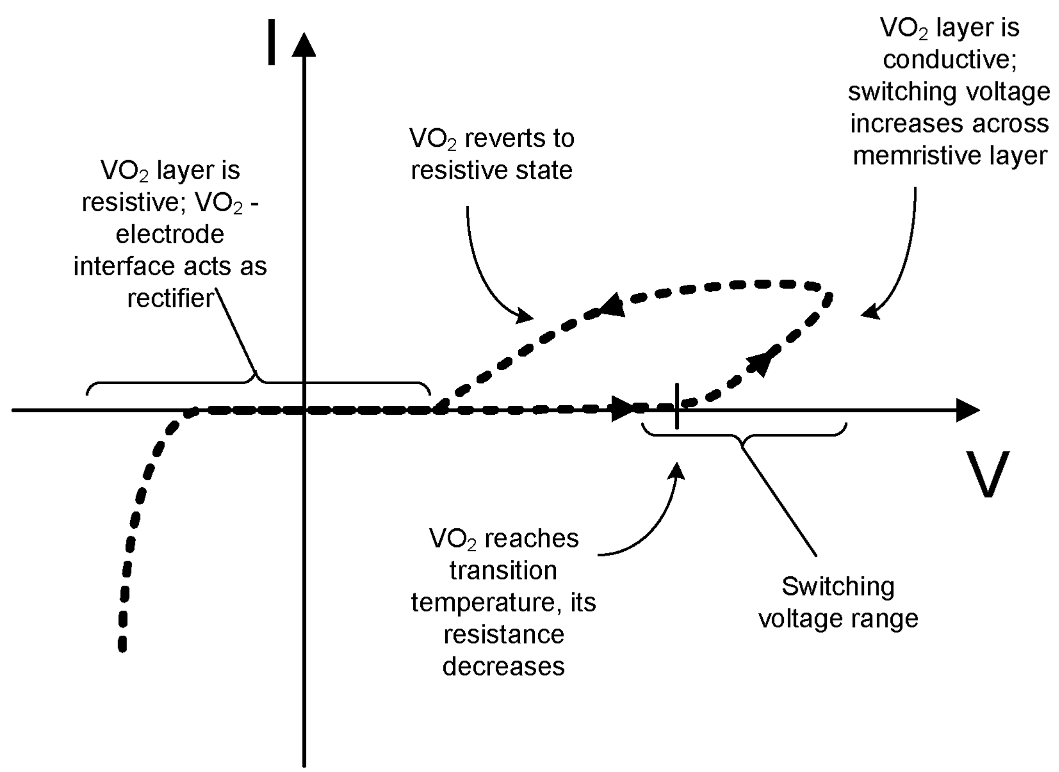
FIG. 5 is a graph illustrating the temperature-dependent and voltage-dependent behavior of a rectifying interface according to one embodiment described herein.

The behavior of the interface 420 is also illustrated in FIG. 5. It should be noted that the graph is provided for purposes of illustration and is not intended to limit the particular current or voltage values that may be exhibited by any embodiment. At forward bias and moderate reverse bias, the interface 420 behaves as a rectifier as described above. However, another result of incorporating temperature-responsive transition material at the interface 420 is realized when the interface is more strongly reverse-biased to switch the junction "OFF". When this switching voltage is applied to the junction through the electrodes, the field intensity is higher in the initially resistive $VO_2$. At this point, the switching voltage is dropped across both the memristive material and the $VO_2$. The high field intensity in the $VO_2$ causes that material to heat up until it reaches its transition temperature, at which point the $VO_2$ rapidly changes to a highly conductive state. In this state, the resistance of the memristive material is much higher than that of the $VO_2$, so that most of the voltage drop resides across the memristive region. As a result, in either state the switching voltage energy is more effectively used to induce dopant movement. Furthermore, the risk of breakdown of the intrinsic rectifier is avoided, because the interface does not act as a rectifier at the switching voltage. Upon returning to more moderate voltages, the $VO_2$ returns below the transition temperature and reverts to its previous resistive state. The intrinsic rectifier component is thereby restored to the switching junction.

To summarize, a memristive junction element which is configured to provide both stable conductive states and a robust rectifier interface can provide several advantages when incorporated into a nanowire crossbar array. These include the reduction of leakage currents and lower power consumption. The stability of the device during programming allows for higher programming voltages to be used and quicker write times to be achieved.

While the forgoing exemplary embodiments are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A memristive junction with intrinsic rectification, comprising:

a first electrode;

a second electrode;

a memristive region situated between the first electrode and the second electrode, and configured to switch between two activation states via a switching voltage applied between the first electrode and the second electrode and wherein the activation state can be determined by application of a reading voltage between the first electrode and the second electrode; and a rectifier region disposed at an interface between the first electrode and the memristive region and comprising a layer of a temperature-responsive transition material that is substantially conductive at or above a switching temperature and substantially resistive below the switching temperature, wherein the applied switching voltage is to cause the temperature-responsive transition material to reach the switching temperature.

2. The memristive junction of claim 1, wherein the temperature-responsive transition material is an oxide of at least one of vanadium, manganese, molybdenum, titanium, and iron.

3. The memristive junction of claim 2, wherein the temperature-responsive transition material is vanadium dioxide.

4. The memristive junction of claim 1, wherein the memristive region comprises a memristive material containing mobile dopants.

5. The memristive junction of claim 4, wherein the semiconductor material is selected from titania, hafnia, zirconia, strontium titanate, and gallium nitride.

6. The memristive junction of claim 4, wherein the mobile dopants are selected from the group consisting of charged vacancies, anions, cations, or combinations thereof.

7. The memristive junction of claim 1, wherein the switching voltage has a magnitude of from about 1.0 V to about 2.5 V.

8. The memristive junction of claim 1, wherein the reading voltage has a magnitude of from about 0.01 V to about 0.8 V.

9. A memristive junction array, comprising:

a layer of bottom wires, arranged substantially parallel to each other;

a layer of top wires arranged substantially perpendicular to the bottom wires and overlaying the bottom wires at a plurality of intersections, and a device as in claim 1 situated at each intersection so that the first electrode is electrically connected to one of the bottom wires and the second electrode is electrically connected to one of the top wires.

10. A method of making a memristive junction, comprising:

depositing a first electrode onto a substrate;

depositing onto the first electrode a layer of temperature-responsive transition material capable of assuming a conductive state at or above a switching temperature and assuming a substantially resistive state below the switching temperature;

depositing a layer of memristive material onto the layer of temperature-responsive transition material to create a memristive region; and depositing a second electrode onto the layer of memristive material.

11. The method of claim 10, wherein the temperature-responsive transition material is an oxide of at least one of vanadium, manganese, molybdenum, titanium, and iron.

12. The method of claim 11, wherein the temperature-responsive transition material is vanadium dioxide.

13. The method of claim 10, wherein the memristive region comprises a semiconductor material containing mobile dopants.

14. The method of claim 13, wherein the semiconductor material is selected from titania, hafnia, zirconia, strontium titanate, and gallium nitride.

15. The method of claim 13, wherein the mobile dopants are selected from the group consisting of charged vacancies, anions, cations, or combinations thereof.

* * * * *